US007863106B2

(12) United States Patent
Christo et al.

(10) Patent No.: US 7,863,106 B2
(45) Date of Patent: Jan. 4, 2011

(54) SILICON INTERPOSER TESTING FOR THREE DIMENSIONAL CHIP STACK

(75) Inventors: Michael Anthony Christo, Round Rock, TX (US); Julio Alejandro Maldonado, Austin, TX (US); Roger Donell Weekly, Austin, TX (US); Tingdong Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/343,678

(22) Filed: Dec. 24, 2008

(65) Prior Publication Data

US 2010/0155888 A1 Jun. 24, 2010

(51) Int. Cl.
*H01L 21/44* (2006.01)
*H01L 23/02* (2006.01)

(52) U.S. Cl. .................... 438/119; 438/15; 438/125; 257/685; 257/723

(58) Field of Classification Search .................. 438/15, 438/118, 119, 121, 125, 455; 257/685, 686, 257/723, 724, 778, 782, 783
See application file for complete search history.

(56) References Cited

U.S. PATENT DOCUMENTS

| 4,724,383 A | 2/1988 | Hart |
| 5,198,756 A | 3/1993 | Jenkins |
| 5,490,028 A | 2/1996 | Ang |
| 5,544,774 A | 8/1996 | Gray |
| 5,563,754 A | 10/1996 | Gray |
| 5,621,594 A | 4/1997 | Gray |
| 5,673,474 A | 10/1997 | Watterston |

(Continued)

FOREIGN PATENT DOCUMENTS

EP    0 751 566 A2    2/1997

OTHER PUBLICATIONS

Bulkeley—"IBM Touts Break-Through in 3-D Chips"—The Wall Street Journal (Apr. 2007).

(Continued)

*Primary Examiner*—Kevin M Picardat
(74) *Attorney, Agent, or Firm*—Matt Talpis; Mark P Kahler

(57) ABSTRACT

A testing method for a silicon interposer employs a test probe and an electrically conductive glass handler. The silicon interposer includes multiple interconnects that extend between the opposed major surfaces of the interposer, namely from a test side of the interposer to a conductive glass handler side of the interposer. On the glass handler side, the interposer includes a layer of patterned insulative resist with open regions at some interconnects on the glass handler side and remaining resist regions at other interconnects on the glass handler side. The interposer may include a conductive adhesive layer that couples together interconnects at the open regions on the glass handler side. In this manner, a probe may send a test signal from a first interconnect at one location on the test side of the interposer, through the first interconnect, through the conductive adhesive, through a second interconnect to another probe on the test side of the interposer. The method thus provides same-sided probe testing of the interposer. The method also provides for loading or power application to the conductive glass handler and testing of circuits and interconnects on the test side of the silicon interposer.

22 Claims, 10 Drawing Sheets

U.S. PATENT DOCUMENTS

| | | | |
|---|---|---|---|
| 5,684,660 A | 11/1997 | Gray | |
| 5,737,825 A | 4/1998 | Gray | |
| 5,748,417 A | 5/1998 | Malhotra | |
| 5,754,377 A | 5/1998 | Gray | |
| 5,777,824 A | 7/1998 | Gray | |
| 5,801,909 A | 9/1998 | Gray | |
| 5,818,246 A | 10/1998 | Zhong | |
| 5,844,412 A | 12/1998 | Norton | |
| 6,294,908 B1 | 9/2001 | Belmove | |
| 6,521,841 B2 | 2/2003 | Kawaguchi | |
| 6,528,343 B1* | 3/2003 | Kikuchi et al. | 438/106 |
| 6,569,711 B1* | 5/2003 | Susko et al. | 438/115 |
| 6,620,652 B1* | 9/2003 | Shibata | 438/119 |
| 6,734,681 B2 | 5/2004 | Sabey | |
| 6,800,537 B2* | 10/2004 | Haba | 438/455 |
| 6,802,930 B2* | 10/2004 | Chuang et al. | 438/119 |
| 6,806,581 B2* | 10/2004 | Hsieh | 257/782 |
| 6,900,648 B2 | 5/2005 | Ou | |
| 7,129,732 B1 | 10/2006 | Knadle | |
| 7,262,610 B2* | 8/2007 | Ohtaki | 324/754 |
| 7,282,794 B2 | 10/2007 | Akram | |
| 7,390,700 B2 | 6/2008 | Gerber | |
| 2008/0272794 A1* | 11/2008 | Grube et al. | 324/754 |

OTHER PUBLICATIONS

Dang—"3D Chip Stacking with C4 Technology"—IBM (Nov. 2008).

Jayantha—"Thermomechanical Modeling of 3d Electronic Packages"—IBM (Nov. 2008).

Knickerbocker-1—"Three-Dimensional Silicon Integration"—IBM JRD (Nov. 2008).

Knickerbocker-2—"Development of Next-Generation System-On-Package (SOP) Technology Based on Silicon Carriers with Fine-Pitch Chip Interconnection"—IBM JRD (Jul. 2005).

Manzer—"High-Speed Electrical Testing of Multichip Ceramic Modules"—IBM JRD (Sep. 2005).

Micronews—"Silicon Interposers Wait for an Application"—Web Content—I-Micronews (Jul. 2008).

Sakuma—"3D Chip-Stacking Technology with Through-Silicon Vias and Low-Volume Lead-Free Interconnections"—IBM JRD (Nov. 2008).

Lewis—"Advanced Packaging"—Jun. 2003.

Tanaka—"SiP Manufacturing Will Benefit from Caulked Connections . . . " Renseas Tech (Copyright 2005).

Uno—"New Techniques For Module Packaging", Tech-On (Feb. 2008).

Woods—"Jet Dispensing—The Underfill Solution", SMT (Jan. 2005).

Das—"A High Performance C4 Probe", 2001 Southwest Test Workshop (Jun. 4, 2001).

* cited by examiner

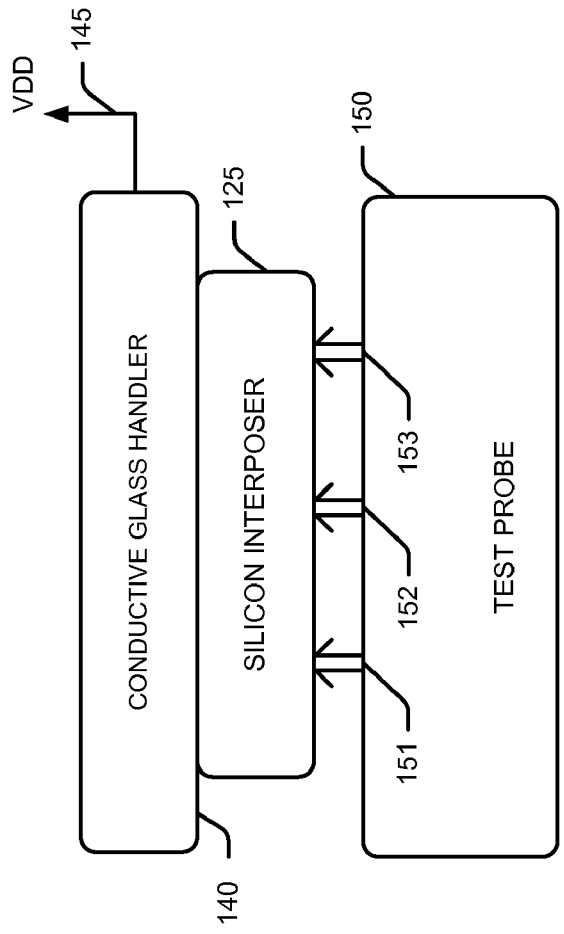

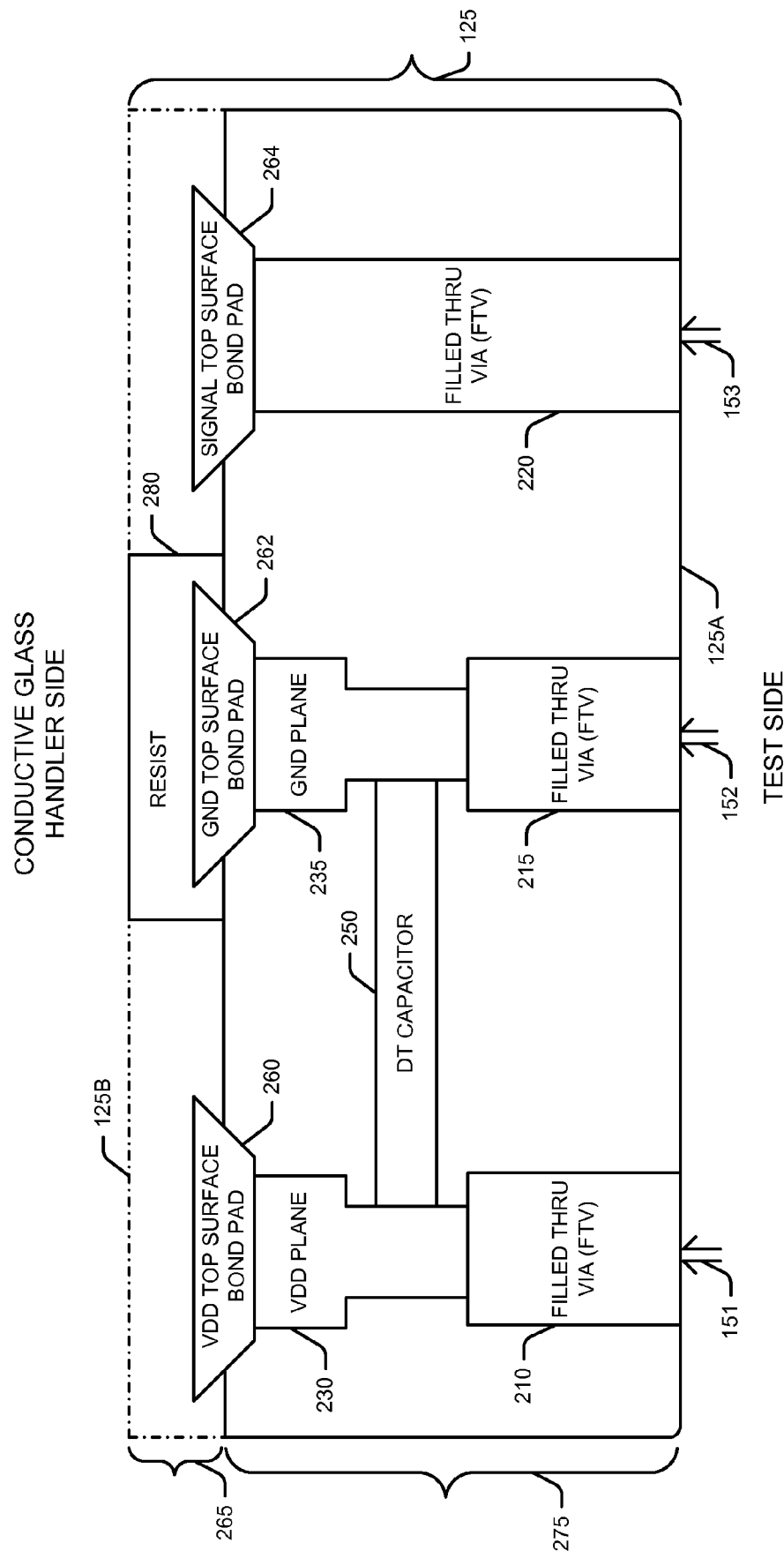
FIG. 2B  SILICON INTERPOSER

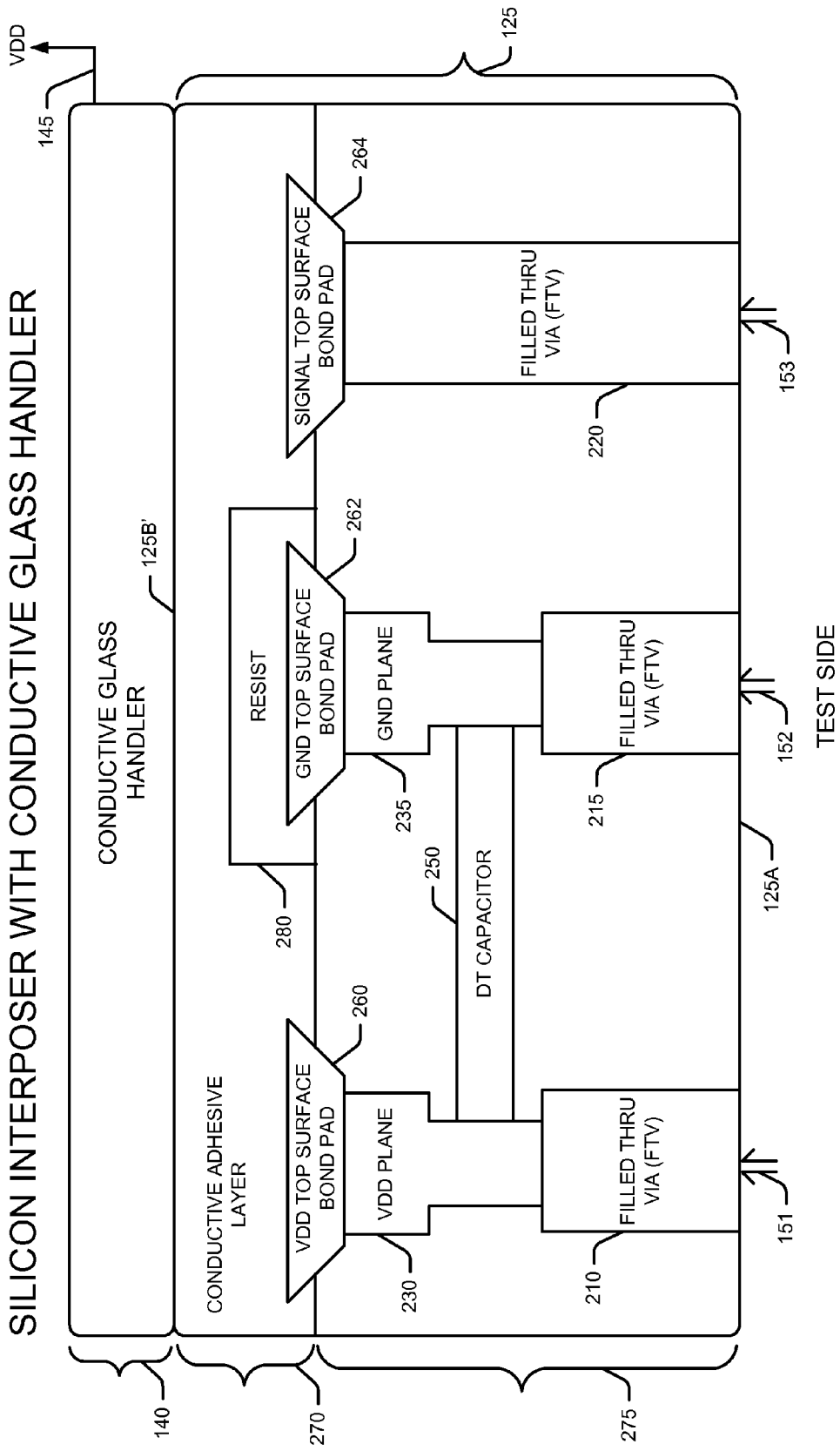
FIG. 2D  SILICON INTERPOSER WITH CONDUCTIVE GLASS HANDLER

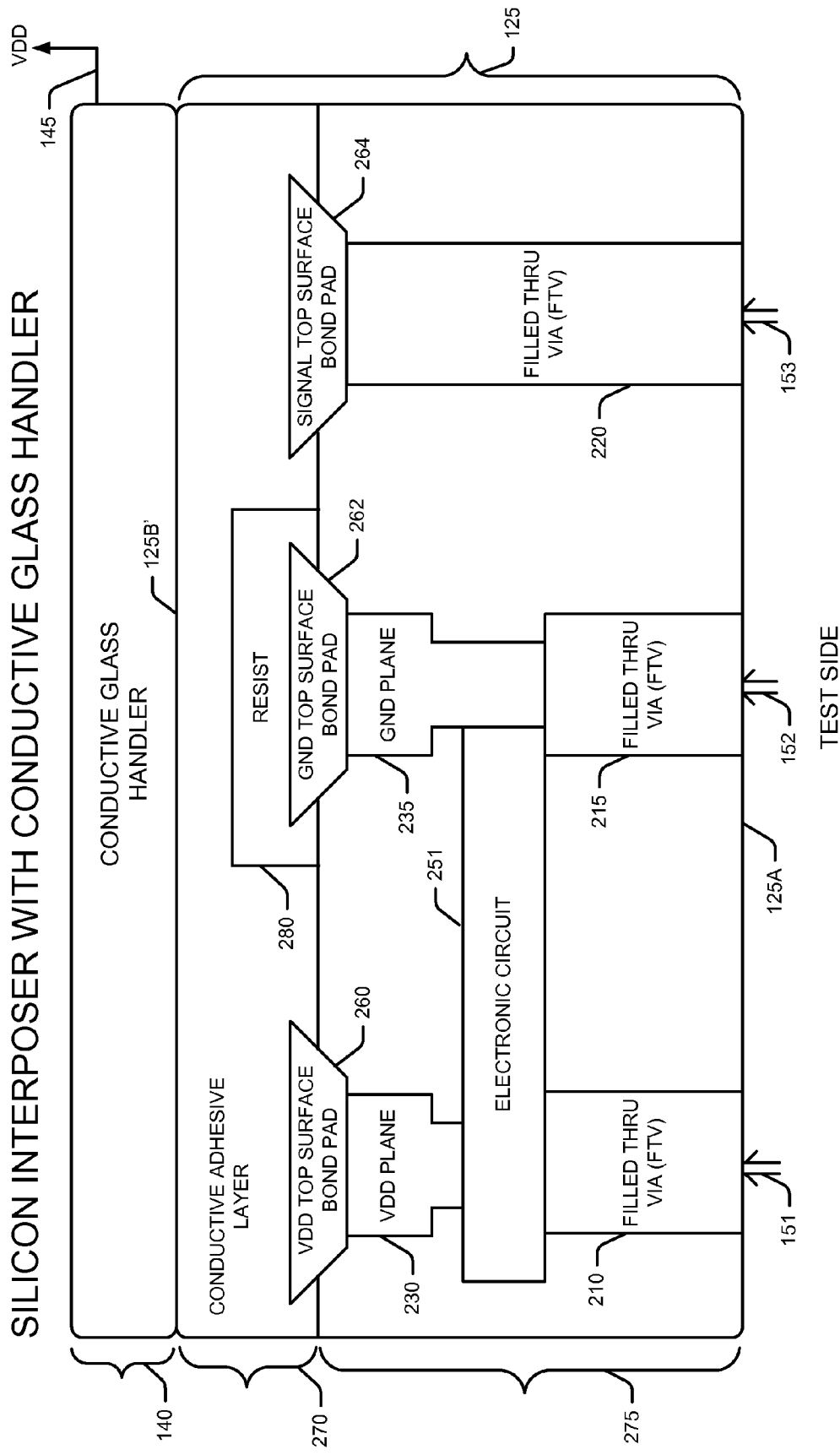

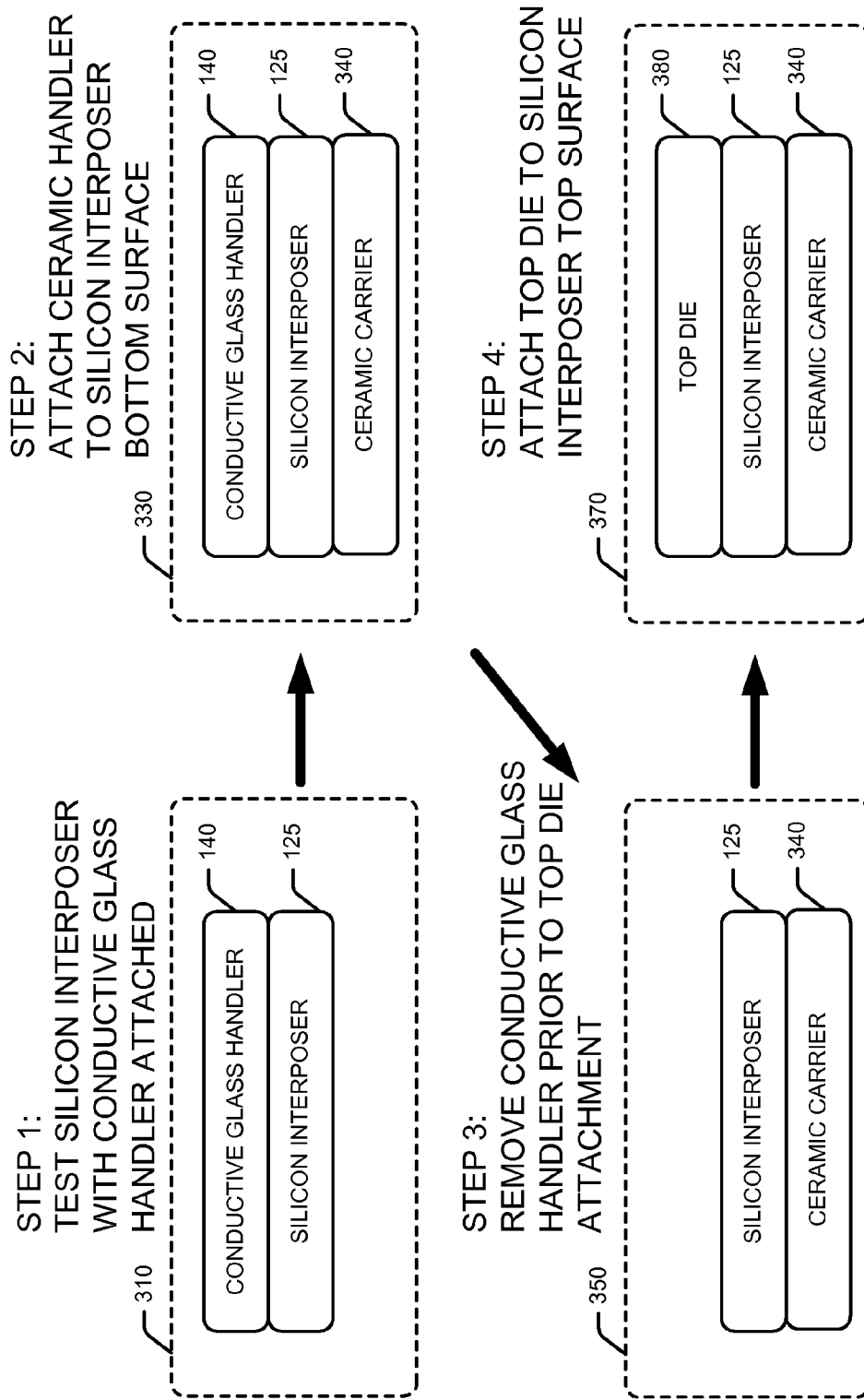

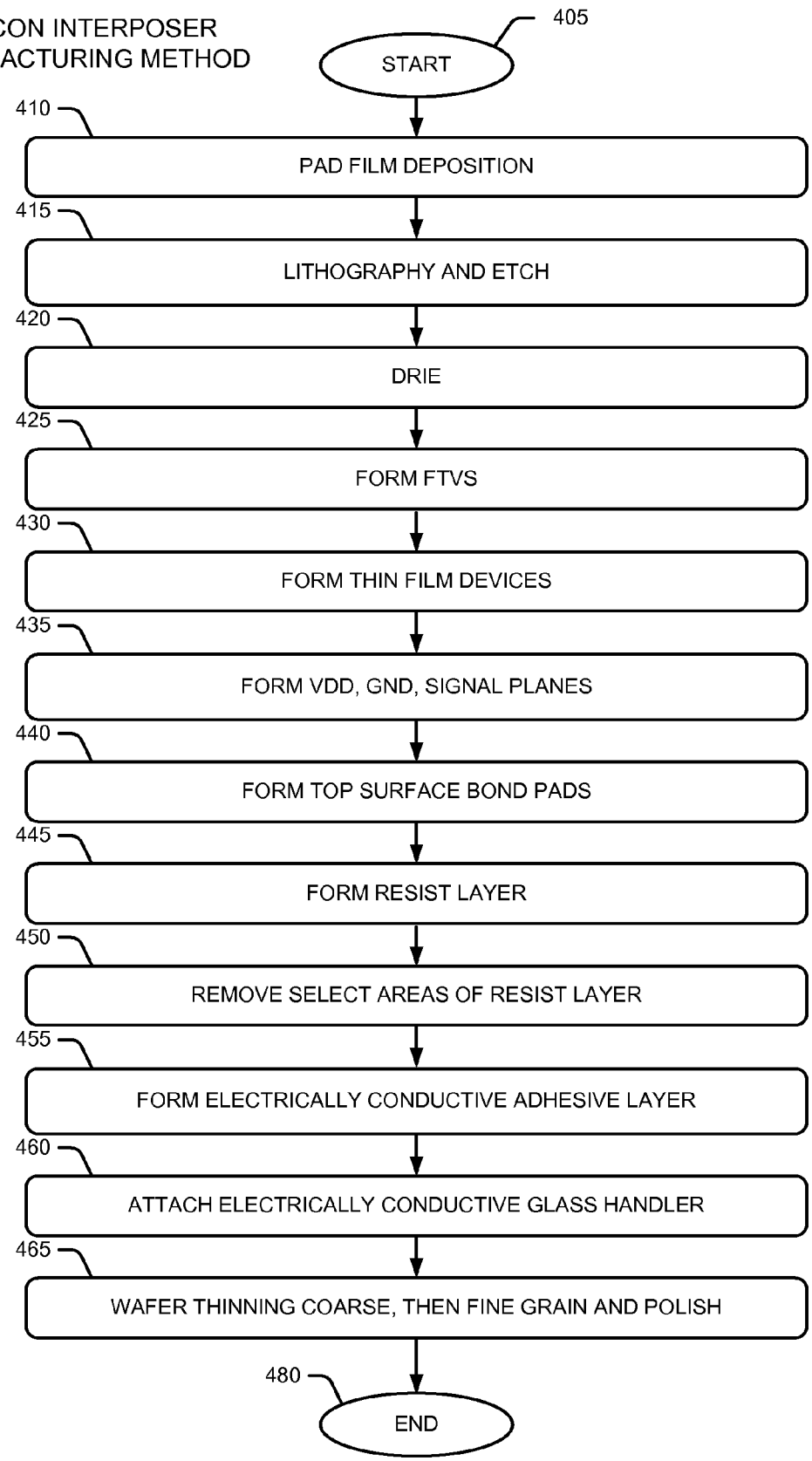

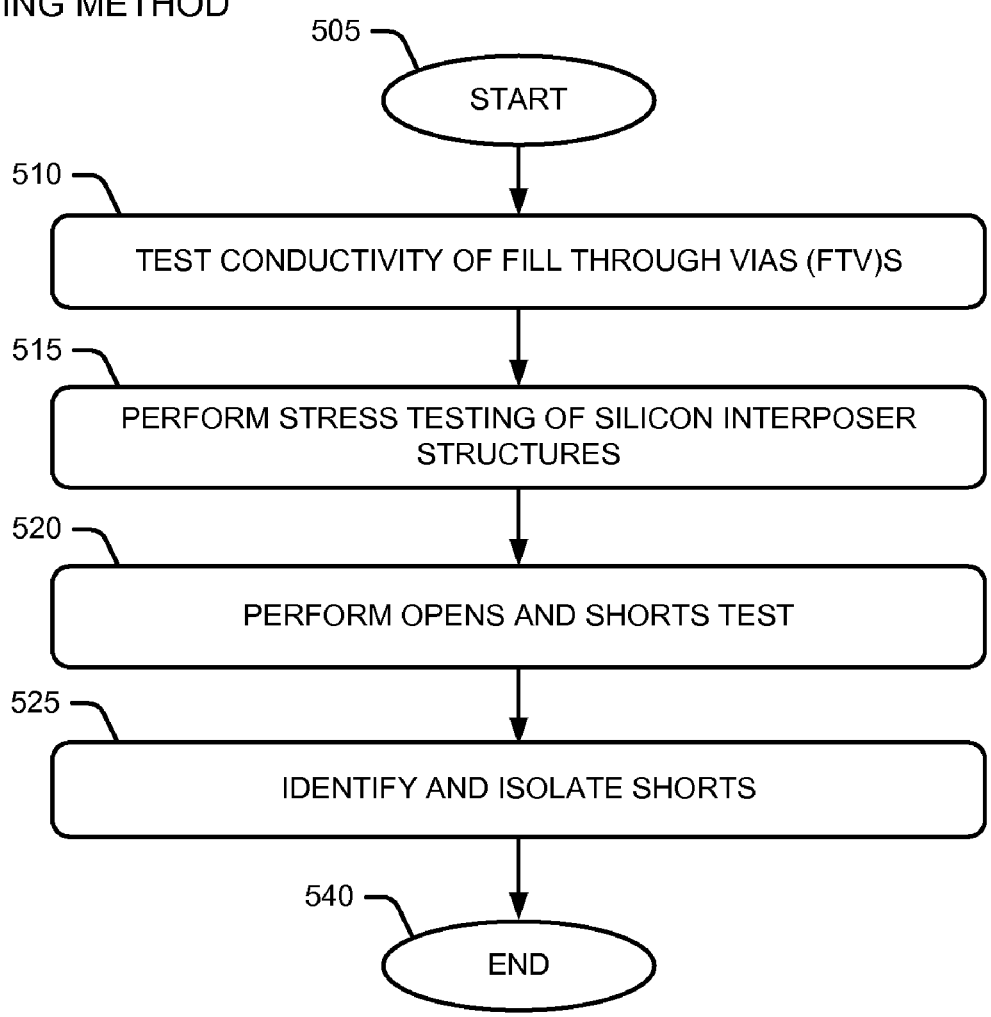

SILICON INTERPOSER TESTING FOR THREE DIMENSIONAL CHIP STACK

BACKGROUND

The disclosures herein relate generally to silicon integrated circuit chips (IC)s, and more specifically, to multi-layer and multi-chip IC manufacturing and test methodologies.

Modern IC designs contain multiple layers of integration that include semiconductor active devices as well as passive components. Distinct IC chips may stack or attach to each other in a vertical fashion to form a multi-chip stack. The chip stack is a 3 dimensional (3D) package that may require interconnecting through-via structures to pass signals and power through the chip stack. Silicon interposers include IC chips that contain through-via structures.

BRIEF SUMMARY

Accordingly, in one embodiment, a method of manufacturing a semiconductor interposer is disclosed. The method includes forming an interposer subassembly of semiconductor material including first, second and third interconnects extending from a first surface of the interposer subassembly to a second surface of the interposer subassembly, the first and second surfaces being opposed major surfaces. The method is applicable to an interposer which may include active and passive elements to form electronic circuitry attached to some of the first, second, and third interconnects. The method is also applicable to an interposer which may contain interconnects from only one of the first or second surfaces to the active and passive elements. The method also includes forming a non-conductive layer on the first surface of the interposer subassembly. The method further includes selectively removing portions of the non-conductive layer at the first and second interconnects to form open regions at the first and second interconnects, thus forming remaining non-conductive layer portions other than at the first and second interconnects. The method still further includes applying a conductive adhesive layer adjacent the first surface of the interposer subassembly covering the open regions and remaining non-conductive layer portions.

In another embodiment, a semiconductor interposer is disclosed that includes an interposer subassembly of semiconductor material including first, second and third interconnects extending from a first surface of the interposer subassembly to a second surface of the interposer subassembly, the first and second surfaces being opposed major surfaces. The interposer may include active and passive elements that form electronic circuitry attached to some of the first, second, and third interconnects. In one embodiment, the interposer may include interconnects from only one of the first or second surfaces to the active and passive elements. The semiconductor interposer also includes a non-conductive layer on the first surface of the interposer, the non-conductive layer including open regions at the first and second interconnects where the non-conductive layer is removed, thus forming remaining non-conductive layer portions other than at the first and second interconnects. The semiconductor interposer further includes a conductive adhesive layer adjacent the first surface of the interposer subassembly covering the open regions and remaining non-conductive layer portions.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 1 is block diagram of a silicon interposer test fixture that demonstrates the disclosed 3D chip stack interposer testing methodology.

FIGS. 2A-2F shows fabrication steps in the manufacture of the silicon interposer that employs the disclosed testing methodology.

FIG. 3 is a block diagram of silicon interposer assembly process steps that the disclosed chip stack technology testing methodology may employ.

FIG. 4 depicts a flowchart that shows process flow in the manufacturing of silicon interposers with deep trench (DT) capacitors.

FIG. 5 is a flowchart that shows process flow in the disclosed silicon interposer testing method.

DETAILED DESCRIPTION

Figure 2A:
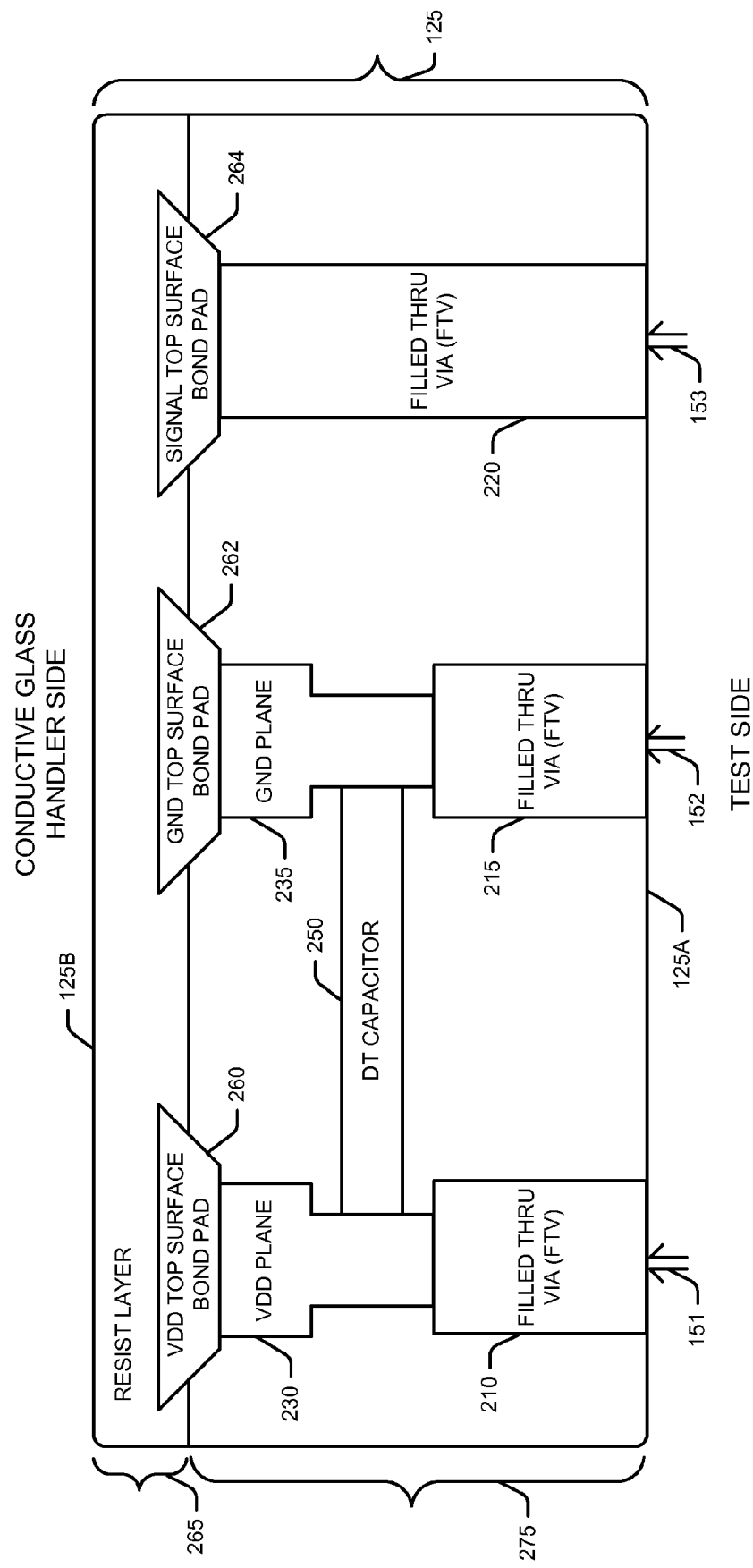

Modern integrated circuit (IC) manufacturing processes require a large number of process steps from start to finish. Silicon interposers play a key role during the manufacturing process of a multi-chip or 3D chip stack. 3D chip stack technology provides a method to vertically stack one integrated circuit (IC) upon another. The IC chips that make up the 3D chip stack and utilize through silicon vias (TSVs) to interconnect multiple chips within the 3D chip stack are referred to herein as silicon interposers. A 3D chip stack may provide a reduction in overall size and power consumption in comparison to some conventional single substrate IC package designs. Silicon interposer design and testing is an important aspect of the overall IC manufacturing process.

FIG. 1 is a block diagram showing a silicon interposer 125 test fixture 100. Silicon interposer test fixture 100 includes a silicon interposer 125 under test. Silicon interposer 125 couples to a cold plate or conductive glass handler 140. As used herein the term "conductive" means electrically conductive. As used herein, the term "insulative" means electrically insulative. Conductive glass handler 140 may provide thermal control and voltage bias potential for the silicon interposer 125 under test. In one example, conductive glass handler 140 may couple to power (VDD) to provide a voltage bias 145 thereto. In another example, conductive glass handler 140 may connect to other voltages including ground (GND), floating (no connection), or other bias voltages during test. A test probe assembly 150 couples to silicon interposer 125 through electrically conductive probes, such as conductive probes 151, 152, 153, etc. Test probe assembly 150 may apply or receive a test voltage or other signal at conductive probes 151, 152, 153, etc.

Test probe assembly 150 may employ a large number of electrically conductive probes, such as conductive probes 151, 152, 153, etc. Conductive probes 151, 152, 153, etc. provide electrical connectivity to the circuitry of silicon interposer 125 and other test fixture 100 hardware. Conductive probe 151, for example, may provide electrical connectivity between test probe assembly 150 and a signal node of silicon interposer 125 by making electrical contact with controlled collapse chip connection (C4) bumps or bond pads (described in FIGS. 2A-2E below) on the top surface of silicon interposer 125. In one embodiment, conductive probe 151, for example, may provide a test voltage to filled-through via (FTV) 210 on a test side 125A of silicon interposer 125, as seen in FIG. 2A. Filled-through vias (FTVs) may be referred to as through silicon via (TSV) structures.

FIGS. 2A-2E show more detail of the silicon interposer 125 assembly that further demonstrates the disclosed 3D chip stack silicon interposer testing methodology. FIG. 2A shows a portion of a cross-section of silicon interposer 125 as a side view of interconnecting IC layers. Silicon interposer 125 includes a filled-through via (FTV) 210, an FTV 215, and an FTV 220. In one example, FTV 210 employs tungsten (W) fill to provide electrical conductivity. In actual practice, silicon interposer 125 may employ many more FTVs than FTV 210, FTV 215, FTV 220 to provide electrical connectivity between internal structures within silicon interposer 125 and test side 125A of silicon interposer 125.

A supply voltage (VDD) plane 230 and a ground (GND) plane 235 are internal metal layers that back-end-of-line (BEOL) processes may form during silicon interposer 125 fabrication. Conventional semiconductor processes may form active or passive devices within silicon interposer 125. Passive devices of silicon interposer 125 may include deep trench (DT) capacitors, resistors, interconnects and other passive devices. Active devices of silicon interposer 125 may include transistors, diodes, and other active devices. In one embodiment, DT capacitor 250 and other DT capacitors may provide power decoupling by using decoupling capacitance for devices that connect to silicon interposer 125. For example, in a 3D chip stack, DT capacitor 250 and other DT capacitors included in silicon interposer 125 may significantly reduce the power noise due to chip level switching activities, such as those of signal node voltage changes.

A VDD top surface bond pad 260 or C4 bump couples to VDD plane 230. A GND top surface bond pad 262 couples to GND plane 235. A signal top surface bond pad 264 couples to FTV 220. Silicon interposer 125 may include active and passive circuitry in a silicon interposer subassembly 275. Silicon interposer subassembly 275 may contain multiple dielectric, polysilicon, and other layers that combine to form the substrate of silicon interposer 125. A resist layer 265 of electrically insulative material or photoresist coats the top of silicon interposer subassembly 275 as shown. In this manner, resist layer 265 forms a top surface 125B of the silicon interposer. Subsequent processing may selectively remove portions of resist layer 265 to provide electrically insulative regions of remaining resist, such as those described below in FIG. 2B.

FIG. 2B depicts the removal of selected portions of resist layer 265. Lithography and other processes may remove selected portions of resist layer 265 during silicon interposer 125 manufacturing to form a remaining resist region 280, and other remaining resist regions not shown. Remaining resist region 280 is a resist region of silicon interposer 125 that exhibits electrically insulative properties. In one example, remaining resist region 280 provides electrical insulation of GND top surface bond pad 262 to top surface or conductive glass handler side 125B. In one embodiment, lithography and other processes provide selective removal of resist layer 265 above and around VDD top surface bond pad 260, and signal top surface bond pad 264 as shown.

Figure 2C:
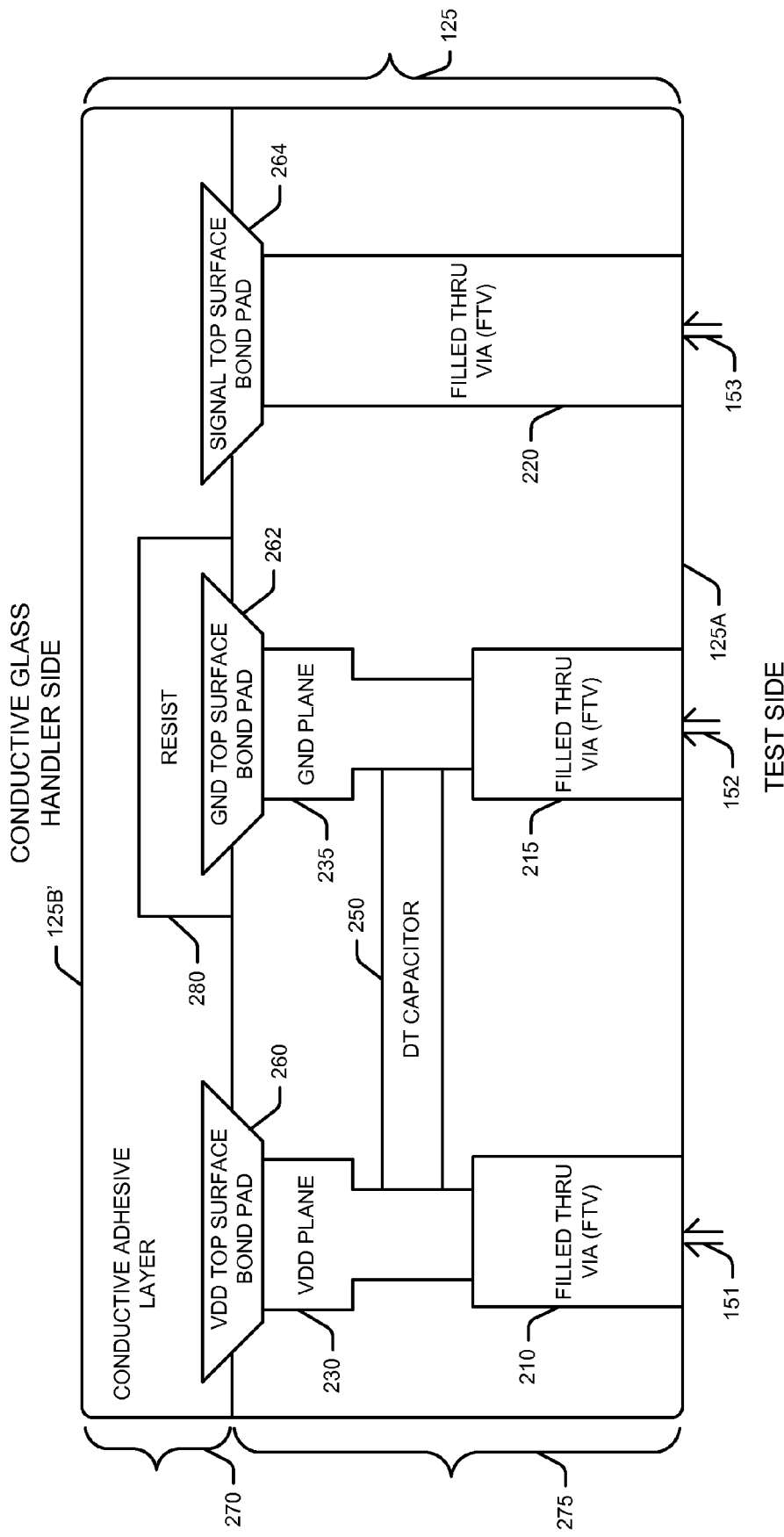

FIG. 2C shows the deposition of a conductive adhesive layer 270 on the top surface of silicon interposer subassembly 275 to form conductive glass handler side surface 125B' in FIGS. 2C-2E. Conductive glass handler side surface 125B' is the top surface of conductive adhesive layer 270 and the top surface of silicon interposer 125. FIG. 2C represents the completion of the assembly or manufacturing processes for silicon interposer 125. FIG. 2D shows the attachment of an electrically conductive glass handler 140 to the top surface 125B' of silicon interposer 125. Conductive glass handler 140 may provide a voltage bias 145, such as VDD or other voltage to conductive glass handler 140. In one embodiment of silicon interposer 125 under test, the voltage bias 145 is floating and provides no bias or voltage potential to conductive glass handler 140. Filled-through via (FTV) 210, VDD plane 230 and VDD top surface bond pad 260 together form one interconnect that extends from the test side of interposer 125 to conductive adhesive layer 270. Filled-through via (FTV) 215, ground (GND) plane 235 and ground (GND) top surface bond pad 262 together form another interconnect that extends from the test side 125A of interposer 125 to internal silicon interposer 125 circuit elements, such as DT capacitor 250. Electrically non-conductive remaining resist region 280 ensures that there is no ground to VDD short through conductive adhesive layer 270. Filled-through via (FTV) 220 and signal top surface bond pad 264 together form another interconnect that extends from the test side 125A of interposer 125 to conductive adhesive layer 270.

Silicon interposer 125 may provide decoupling capacitance, electrical connectivity and power regulation for attaching dies, such as a top IC die 380, described below with reference to FIG. 3. The structure of silicon interposer 125 provides for testability through both of opposed sides 125A and 125B'. For example, test fixture 100 of FIGS. 1 and 2 may employ conductive glass handler 140 to provide voltage bias 145 to one side of silicon interposer 125. In one embodiment, test probe assembly 150 may measure conductivity using conductive probes 151 and 152 to detect a connection or bias voltage 145 from conductive glass handler 140. During testing, the silicon interposer 125 should preferably be active or under voltage bias 145 loading from an external power source. That voltage bias 145 that applies to conductive glass handler 140 provides VDD or power supply load for testing to circuits within silicon interposer 125, such as DT capacitor 250, and other circuits or devices not shown. For example, a user may apply voltage VDD to conductive glass handler 140 and ground to FTV 215 through conductive probe 152. In this scenario, the user may test circuits within the interposer such as DT capacitor 250, for example, or other internal circuits not shown. In this particular test, the test path is between conductive glass handler 140 and a probe such as 152. In other words, this test is "through the interposer" from glass handler side surface 125B' through DT capacitor 250 to test side surface 125A, or vice versa depending on voltage polarity VDD therebetween.

Referring to FIG. 2D, in another embodiment of the disclosed interposer and testing method, FTVs such as FTV 210 and FTV 220 provide bottom surface to top surface and return connectivity testing ability. With the proper placement and orientation of electrically insulative photoresist regions, such as remaining resist region 280, and other resists (not shown), test probe assembly 150 may apply power, signal, or a particular test voltage to one side of silicon interposer 125, namely test side 125A. Test probe assembly 150 receives the particular test voltage as it routes through the interposer structure, such as through FTV 220 and back through FTV 210. In this example, the electrically conductive path includes FTV 220, signal top surface bond pad 264, conductive adhesive layer 270, VDD top surface bond pad 260, VDD plane 230, and FTV 210. During this testing, conductive glass handler 140 voltage bias 145 is floating, or not providing a bias voltage. This approach provides one-sided-testing or same-sided testing because the test signal or voltage flows from one side of the interposer at conductive probe 153 through the interposer 125 and back to the same side of the interposer, namely to conductive probe 151.

In one embodiment, this same-sided testing includes conductivity testing through silicon interposer 125 circuit elements. More particularly, the test signal or voltage flows from conductive probe 153 through the interconnect that FTV 220, and signal top surface pad 264 forms, and then flows through conductive adhesive layer 270 and back to conductive probe 151 via the interconnect that VDD top surface bond pad 260, VDD plane 230 and FTV 210 forms. The test signal or voltage thus returns to the same side of the interposer at which the test signal or voltage originated, namely the test side of interposer 125 as seen in FIG. 2D. In the example of FIG. 2D, DT capacitor 250 couples between VDD plane 230 of one interconnect to GND plane 235 of another interconnect. Same-side testing of capacitor 250 is achievable by supplying a test voltage between FTV 210 and FTV 215 via conductive probes 151 and 152, respectively.

In this same-sided testing approach, bond pads not involved in the test exhibit remaining resist regions above and surrounding such bond pads. For example, remaining resist region 280 is above and around GND top surface bond pad 262. This effectively isolates the interconnect formed by bond pad 262, GND plane 235 and FTV 215 from the test. In contrast, those bond pads involved in the same-sided test, have the resist above and around such bond pads removed, as shown in FIG. 2D. This exposes both bond pads 260 and 264 to conductive adhesive layer 270, thus allowing current flow therebetween during the same-sided test. During this type of same-sided testing, the conductive glass handler 140 is floating or, in other words, voltage bias 145 does not connect to any particular voltage potential. Interaction of other nodes, such as FTVs of silicon interposer 125 not shown may impact the results of any same-sided testing results.

In another embodiment this same-sided testing method, voltage bias 145 provides conductive glass handler 140 VDD or a power supply load for testing to circuits within silicon interposer 125. Such circuits include DT capacitor 250, or other integrated circuits and devices not shown, for example, a low drop out linear voltage regulator of silicon interposer 125. Those circuits may not have a VDD interconnect on the test side 125A of silicon interposer 125. Resists regions, such as remaining resist region 280 adjacent the conductive glass handler side 125B of silicon interposer 125 provide electrical isolation of specific regions of silicon interposer 125, such as GND top surface bond pad 262 during testing.

FIG. 2E shows silicon interposer 125 that includes an electronic circuit 251 that may include active or passive electronic circuit elements. Circuits or devices of silicon interposer 125, such as electronic circuit 251, and other integrated circuits, not shown, may not have an interconnect on the test side 125A of silicon interposer 125. As shown in FIG. 2E, silicon interposer 125 employs resists regions, such as remaining resist region 280 to the conductive glass handler side 125B of silicon interposer 125. Remaining resist regions provide electrical isolation during testing of circuits, such as electronic circuit 251 within silicon interposer 125 that may not have an independent ground or power source available on test side 125A. For example, the conductive glass handler 140 may provide voltage bias 145 load to VDD and signal bond pads such as VDD top surface bond pad 260, and signal top surface bond pad 264 as well as other bond pads not shown in FIG. 2E. During application of voltage bias 145, test probes such as conductive probe 152 may bias GND to energize electronic circuit 251. Other interconnects, such as FTV 210 on the test side 125A of silicon interposer 125 may provide signal access to or from electronic circuit 251. This approach provides through-the-interposer or two-sided testing by powering electronic circuit 251 by voltage sources from one side of silicon interposer 125. The two-sided testing approach also provides ground and test signals from the opposite side of silicon interposer 125.

Figure 2F:
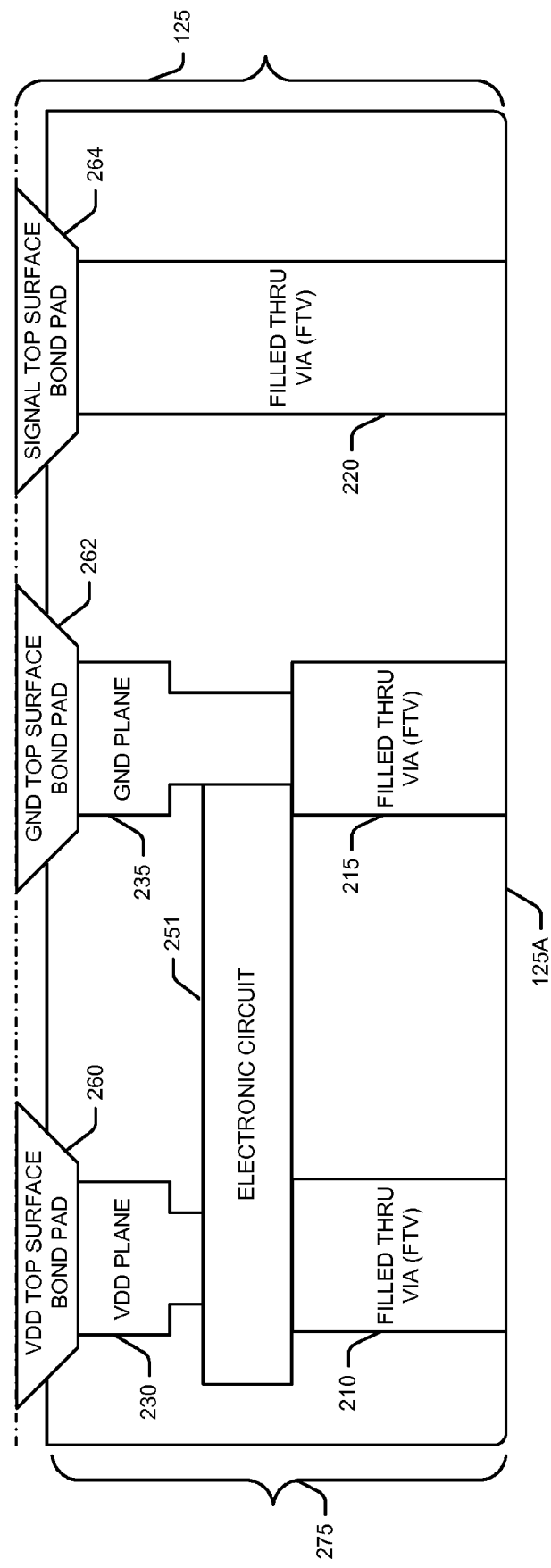

FIG. 2F shows the silicon interposer after the removal of conductive glass handler 140 and other structures to form a silicon interposer assembly ready for attachment to an adjacent die. More particularly, FIG. 2F depicts the removal of conductive glass handler 140, conductive adhesive layer 270, and remaining resist region 280 to form the silicon interposer assembly ready structure of silicon interposer 125. In another embodiment, silicon interposer 125 as shown in FIG. 2F may undergo the formation of additional structures. For example, silicon interposer 125 may undergo formation of resist regions, such as remaining resist region 280 or other regions such as conductive adhesive layer 270 and conductive glass handler 140 for more testing as shown in FIG. 2D or FIG. 2E. After that testing the remaining resist region 280, conductive adhesive layer 270, and conductive glass handler 140 undergo a removal process as demonstrated above in FIG. 2F to form the silicon interposer assembly therein depicted.

FIG. 3 depicts silicon interposer 125 assembly process STEPS 1-4 at a high level. It is desirable to test silicon interposer 125 prior to chip stack assembly using silicon interposer 125. Early silicon interposer testing may provide better detection of problems prior to final IC production, such as chip stack completion. Early testing of silicon interposer 125 in the IC manufacturing process may improve IC yields, production costs, and other variables. The silicon interposer 125 assembly process includes a STEP 1 that includes the attachment of silicon interposer 125 to electrically conductive glass handler 140 to form assembly 310 shown in dashed line. Conductive glass handler 140 provides a structural platform to protect the silicon interposer 125 during movement or other manufacturing processes. For example, conductive glass handler 140 provides a support or carrier for the silicon interposer 125 under test. The silicon interposer 125 may include remaining electrically non-conductive or insulative resist regions, such as remaining resist region 280. Remaining resist region 280 insulates a portion of the silicon interposer 125 structure, such as GND top surface bond pad 262.

STEP 1 provides a silicon interposer assembly 310 that a manufacturing process may employ during test prior to attachment of the interposer to another IC die structure. STEP 2 shows the attachment of a ceramic carrier 340 to the silicon interposer assembly of STEP 1 to form an assembly 330. This may include solder interconnections of FTVs to conductive circuit pads, such as top surface bond pad 262 on the carrier. As a part of this process, an addition of electrically insulative underfill may provide mechanical integrity or interconnect protection between silicon interposer 125 and ceramic carrier 340. In one embodiment, an organic based carrier may be used in place of ceramic carrier 340. Ceramic carrier 340, organic based carriers, and other carriers are examples of flip-chips, With the structural support of ceramic carrier 340, conductive glass handler 140 is no longer a structural requirement. STEP 3 shows the removal of conductive glass handler 140, conductive adhesive layer 270 and any remaining resist regions such as remaining resist region 280 from assembly 330 of STEP 2 to form assembly 350. The silicon interposer 125 attachment method may employ a laser ablation or other technique to remove conductive glass handler 140, conductive adhesive layer 270, and remaining resist region 280 as shown in FIG. 2E.

After cleaning the exposed surface of silicon interposer 125 of assembly 350, a top die 380, namely an IC, attaches to silicon interposer 125 by use of a low melt alloy or other connecting process in STEP 4 to form assembly 370. The silicon interposer assembly process may include an underfill step to complete the silicon interposer 125 assembly. Under-filling forms an electrically insulative structural material surrounding the electrical interconnects that connect the 3D chip stack together between top die 380 and 125B of the silicon interposer 125 assembly and also between 125A of the silicon interposer 125 and ceramic carrier 340.

FIG. 4 shows a flowchart that describes one embodiment of the disclosed silicon interposer 125 manufacturing method. In one embodiment, the silicon interposer 125 manufacturing or fabrication method involves semiconductor production steps that include formation of thin film devices, such as deep trench (DT) capacitor 250, within the interposer. The silicon interposer 125 manufacturing method may include multiple manufacturing processes such as lithography, deposition, etching and other processes. Each silicon interposer 125 manufacturing process may employ fabrication equipment such as lithographers, etchers, deposition equipment, and other thin film semiconductor fabrication equipment. The silicon interposer 125 manufacturing method starts, as per block 405.

In one embodiment, the silicon interposer 125 manufacturing process includes a pad film deposition step, as per block 410. The pad film deposition deposits polysilicon on a P-substrate or other substrate to form a base layer, such as silicon interposer subassembly 275 as shown in FIG. 2A. The manufacturing process performs lithography and etch operations on silicon interposer subassembly 275, as per block 415. For example, the silicon interposer 125 manufacturing process may apply a 2.3 micron ultraviolet (UV) resist layer to the top surface of silicon interposer subassembly 275 using lithography and etching techniques. The UV resist and etch operations may form open regions on the top surface of silicon interposer subassembly 275 to assist in the formation of vias, such as FTV 210, FTV 215, FTV 220, or other vias in silicon interposer subassembly 275.

The manufacturing process includes a deep reactive ion etching (DRIE) step, as per block 420. The DRIE step may include plasma resist strip and wet clean operations to open regions of silicon interposer subassembly 275 for the formation of filled-through vias (FTVs) or through silicon vias (TSVs). The manufacturing process forms FTVs, as per block 425. In one example, the manufacturing process includes deposition of electrically conductive material such as tungsten (W) to form FTVs, such as FTV 210, FTV 215, FTV 220, or other vias in silicon interposer subassembly 275. The manufacturing process forms thin film devices, as per block 430. In one example, thin film processing forms thin film devices, such as deep trench (DT) capacitors. One example of such a deep trench DT capacitor is DT capacitor 250.

Etch, lithography, deposition and other processes form VDD, GND, and signal planes, as per block 435. The manufacturing process forms VDD, GND, and signal planes such as VDD plane 230, GND plane 235, and other planes of silicon interposer subassembly 275. Etch, lithography, deposition and other processes form VDD, GND, and signal top surface bond pads, as per block 440. The manufacturing process forms VDD, GND, and signal top surface bond pads such as VDD top surface bond pad 260, GND top surface bond pad 262, signal top surface bond pad 264 on the top surface of silicon interposer subassembly 275. Silicon interposer subassembly 275 includes adjacent structures of FTV 210, VDD plane 230, and VDD top surface bond pad 260. These adjacent structures together form an interconnect that provides an electrical connection or electrical path through silicon interposer subassembly 275 from test side 125A to the top surface of silicon interposer subassembly 275. The adjacent structures of FTV 215, GND plane 235, and GND top surface bond pad 262 together form another interconnect that provides an electrically conductive path through silicon interposer subassembly 275. The adjacent structures of FTV 220, namely signal top surface bond pad 264 together form yet another interconnect that provides another electrically conductive path through silicon interposer subassembly 275.

The manufacturing process forms resist layer 265, as per block 445. For example, a strip resist and wet etch seed Ti/Cu/Ti process may form resist layer 265 on the top surface or conductive glass handler side 125B of silicon interposer subassembly 275. Resist layer 265 forms an electrically insulative dielectric layer, such as 2, 5 or other micron negative photoresist on the top surface of silicon interposer subassembly 275. In one example, the form resist layer step 445 forms resist layer 265 on the conductive glass handler side 125B of silicon interposer subassembly 275, as shown in FIG. 2A. The manufacturing process removes selected areas of resist layer, as per block 450. In one example, lithography, etch, and other processes remove portions of resist layer 265 to form electrically insulative resist regions, such as remaining resist region 280 as shown in FIG. 2B. In one embodiment, remaining resist region 280 electrically isolates GND top surface bond pad 262 from contact on the top surface or conductive glass handler side 125B as shown in FIG. 2B.

The manufacturing process forms an electrically conductive adhesive layer, as per block 455. In one example, electrically conductive adhesive layer 270 forms 5 microns in thickness on conductive glass hander side 125B' of silicon interposer subassembly 275, as shown in FIG. 2C. Conductive adhesive layer 270 provides an electrically conductive interface between silicon interposer subassembly 275 and conductive glass handler 140. Silicon interposer subassembly 275 and conductive adhesive layer 270 combine to form silicon interposer 125 as shown in FIGS. 2C-2E. The electrically conductive glass handler 140 attaches to conductive adhesive layer 270, as per block 460. The manufacturing process per block 460 is consistent with the silicon interposer 125 assembly process step 1 that forms assembly 310 of FIG. 3. In one example, conductive glass handler 140 is a wafer lamination 700 microns in thickness providing substantial structural support to the silicon interposer 125 die, as shown in FIG. 2D.

In one embodiment of the disclosed method, conductive adhesive layer 270 and conductive glass handler 140 provide silicon interposer 125 with greater wafer handling and test properties than possible without such structures. The silicon interposer 125 manufacturing process continues with a wafer thinning, coarse, then fine grain and polish step, as per block 465. The wafer thinning processes remove material from the test side 125A of silicon interposer 125. Upon completion of the manufacturing steps of FIG. 4, silicon interposer 125 is ready for test, such as wafer probe testing or other tests. The silicon interposer 125 manufacturing process ends, as per block 480.

FIG. 5 is a flowchart that depicts the steps of a silicon interposer 125 testing method. However the silicon interposer 125 testing includes use of conductive glass handler 140. Conductive glass handler 140 employs a voltage bias 145 connection to a voltage VDD or other voltage that effectively floats or exhibits no voltage bias. The test probe assembly 150 provides connectivity of silicon interposer FTVs, such as FTV 210, 215, 220, etc. The silicon interposer 125 testing method starts, as per block 505. The silicon interposer 125 may attach to conductive glass handler 140 for thermal and voltage bias control using voltage bias 145 of FIG. 1 and FIGS. 2C-2E above. Testers, such as test fixture 100 may bias conductive glass handler 140 with the appropriate voltage for test. Wafer test probe assembly 150 may test silicon interposer 125 circuits, such as DT capacitor 250, and other circuits.

To perform two-sided testing as discussed above, test fixture 100 applies voltage bias 145 to one side of silicon interposer 125 through conductive glass handler 140. Test fixture 100 employs test probe assembly 150 to probe with conductive probes 151,152,153, etc. to FTV 210, FTV 215 and other FTVs of silicon interposer 125. In this manner, test fixture 100 may test active circuitry within the interposer through both sides of the interposer, namely between bottom surface test side 125A and conductive glass handler side 125B, of the silicon interposer 125. Test probe assembly 150 may test the electrical conductivity of the FTVs, as per block 510. In one example, test fixture 100 determines the series resistance for FTV 210 by applying a VDD potential to conductive glass handler 140. Test probe assembly 150 measures the voltage drop from VDD top surface bond pad 260 through to FTV 210 on test side 125A of silicon interposer 125. In another embodiment of the disclosed testing method, test fixture 100 may employ a current source measurement to perform the same FTV 210 or other FTV resistance test. That resistance, or conversely that electrical conductivity, test will verify the electrical conductivity from conductive glass handler side 125B to test side 125A. The electrical conductivity test measures conductivity from top surface bond pads, such as VDD top surface bond pad 260, to FTV 210 or through the entire silicon interposer 125 structure. This approach thus provides two-sided test of the interposer.

In another embodiment, to perform single-sided or same-sided testing of the interposer, silicon interposer 125 test fixture 100 may perform voltage or bias stress testing of silicon interposer structures, as per block 515. Stress testing may provide useful performance data by over-stressing the voltage or current capabilities of silicon interposer 125 structures, such as VDD plane 230 or other structures. Test probe assembly 150 measures voltage and current levels to determine stress performance of silicon interposer 125 internal structures, such as VDD plane 230 or others.

Test fixture 100 tests for electrical opens and shorts from one interconnect to another within the silicon interposer 125 die by performing opens and shorts testing, as per block 520. For example, a short may exist between FTV 210 and FTV 215 within silicon interposer subassembly 275. During the opens and shorts test, conductive glass handler 140 may be floating and providing no voltage bias. That test per block 520 will include a count of DT capacitors, such as DT capacitor 250 that are non-functional. The opens shorts test may determine the leakage resistance due to bad DT capacitors in silicon interposer 125. Test fixture 100 isolates shorts identified above in opens shorts test, as per block 525. In other words, test fixture 100 analyzes the type of short such as signal to GND, signal to VDD, GND to VDD or other shorts. In one example, a VDD to GND short may exist between FTV 210 and FTV 215. In that example, test probe assembly 150 injects a test signal or current at conductive probe 151. That test signal or current flows from conductive probe 151 through FTV 210 and through the VDD to GND short into FTV 215. Test probe assembly 150 detects the test current at conductive probe 152 indicating a short from FTV 210 to FTV 215 or adjacent conductive structures, such as a short through DT capacitor 250. The silicon interposer 125 testing method ends, as per block 540.

The foregoing discloses methodologies wherein a test system may employ a silicon interposer die structure to assist in the production of 3D chip stack technology. The disclosed testing methodology and apparatus may isolate poor or failed components on a silicon interposer and avoid using that interposer in subsequent IC production processing steps.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of manufacturing a semiconductor interposer, comprising:
   forming an interposer subassembly of semiconductor material including first, second and third interconnects extending from a first surface of the interposer subassembly to a second surface of the interposer subassembly, the first and second surfaces being opposed major surfaces;
   forming a non-conductive layer on the first surface of the interposer subassembly;
   selectively removing portions of the non-conductive layer at the first and second interconnects to form open regions at the first and second interconnects, thus forming remaining non-conductive layer portions other than at the first and second interconnects; and
   applying a conductive adhesive layer adjacent the first surface of the interposer subassembly covering the open regions and remaining non-conductive layer portions.

2. The method of claim 1, further comprising positioning a conductive glass handler on the conductive adhesive layer adjacent the first surface of the interposer subassembly, thus forming the semiconductor interposer.

3. The method of claim 1, further comprising positioning a first test probe on the first interconnect at the second surface of the interposer subassembly and positioning a second test probe on the second interconnect at the second surface of the interposer subassembly.

4. The method of claim 3, further comprising supplying a test voltage across the first and second probes at the second surface of the semiconductor interposer such that current flows from the first probe, through the first interconnect, through the adhesive layer, through the second interconnect to the second probe, the second surface of the semiconductor interposer thus forming a test side that provides same-sided testing of the semiconductor interposer via the first and second probes.

5. The method of claim 1, further comprising:
   positioning a first test probe on the first interconnect at the second surface of the interposer subassembly; and
   supplying a test voltage on the conductive glass handler of the semiconductor interposer.

6. The method of claim 1, further comprising:
   positioning a first test probe on the first interconnect at the second surface of the interposer subassembly; and
   supplying a test voltage between the conductive glass handler and the first test probe test interconnects in the semiconductor interposer.

7. The method of claim 1, further comprising forming an electronic circuit between the first and second interconnects within the semiconductor interposer subassembly.

8. The method of claim 7, wherein the electronic circuit is a deep trench capacitor.

9. The method of claim 1, further comprising forming respective filled-through vias at the first, second and third interconnects adjacent the second surface of the interposer subassembly.

10. The method of claim 1, further comprising forming respective bonding pads at the first, second and third interconnects adjacent the first surface of the interposer subassembly.

11. The method of claim 4, further comprising attaching a flip chip carrier at the second surface of the interposer subassembly.

12. The method of claim 11, further comprising removing the conductive glass handler from the interposer subassembly.

13. The method of claim 12, further comprising attaching an integrated circuit die to the silicon interposer.

14. A semiconductor interposer, comprising:
- an interposer subassembly of semiconductor material including first, second and third interconnects extending from a first surface of the interposer subassembly to a second surface of the interposer subassembly, the first and second surfaces being opposed major surfaces;
- a non-conductive layer on the first surface of the interposer, the non-conductive layer including open regions at the first and second interconnects where the non-conductive layer is removed, thus forming remaining non-conductive layer portions other than at the first and second interconnects; and
- a conductive adhesive layer adjacent the first surface of the interposer subassembly covering the open regions and remaining non-conductive layer portions.

15. The semiconductor interposer of claim 14, further comprising a conductive glass handler situated on the conductive adhesive layer adjacent the first surface of the interposer subassembly.

16. The semiconductor interposer of claim 14, wherein the first interconnect is adapted to be coupled to a first test probe at the second surface of the interposer assembly and the second interconnect is adapted to be coupled to a second test probe at the second surface of the interposer subassembly.

17. The semiconductor interposer of claim 14, further comprising an electronic circuit coupled between the first and second interconnects within the semiconductor interposer subassembly.

18. The semiconductor interposer of claim 17, wherein the electronic circuit is a deep trench capacitor.

19. The semiconductor interposer of claim 14, wherein the first, second and third interconnects include respective filled-through vias adjacent the second surface of the interposer subassembly.

20. The semiconductor interposer of claim 14, wherein the first, second and third interconnects include respective bonding pads adjacent the first surface of the interposer subassembly.

21. The semiconductor interposer of claim 15, wherein a flip chip carrier is attached to the second surface of the interposer subassembly.

22. The semiconductor interposer of claim 21, wherein an integrated circuit die is attached adjacent the first surface of the interposer subassembly after removal of the glass handler from the interposer subassembly.

* * * * *